(12) United States Patent
Park et al.

(10) Patent No.: US 12,191,428 B2
(45) Date of Patent: Jan. 7, 2025

(54) LIGHTING MODULE AND LIGHTING DEVICE COMPRISING SAME

(71) Applicant: LG INNOTEK CO., LTD., Seoul (KR)

(72) Inventors: Hoon Park, Seoul (KR); Sa Rum Han, Seoul (KR); Dong Il Eom, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 510 days.

(21) Appl. No.: 17/440,276

(22) PCT Filed: Mar. 18, 2020

(86) PCT No.: PCT/KR2020/003693
§ 371 (c)(1),
(2) Date: Sep. 17, 2021

(87) PCT Pub. No.: WO2020/197158
PCT Pub. Date: Oct. 1, 2020

(65) Prior Publication Data
US 2022/0158048 A1    May 19, 2022

(30) Foreign Application Priority Data

Mar. 22, 2019 (KR) .................. 10-2019-0032949
Sep. 10, 2019 (KR) .................. 10-2019-0112123

(51) Int. Cl.
*H01L 33/58* (2010.01)
*H01L 25/075* (2006.01)
(Continued)

(52) U.S. Cl.
CPC .......... *H01L 33/58* (2013.01); *H01L 25/0753* (2013.01); *H01L 33/50* (2013.01);
(Continued)

(58) Field of Classification Search
CPC ....... H01L 33/50; H01L 33/60; H01L 33/502; H01L 33/52; H01L 33/56; H01L 33/58;
(Continued)

(56) References Cited

U.S. PATENT DOCUMENTS 8,075,148 B2   12/2011   Nada
8,704,254 B2   4/2014    Trottier et al.
(Continued)

FOREIGN PATENT DOCUMENTS

CN   101451673   6/2009
EP   2259351     12/2010
(Continued)

OTHER PUBLICATIONS

Chinese Office Action dated Mar. 17, 2023 issued in Application No. 202080023258.7.
(Continued)

*Primary Examiner* — Mohammad A Rahman
*Assistant Examiner* — Sandra Milena Rodriguez Villan
(74) *Attorney, Agent, or Firm* — KED & Associates LLP

(57) ABSTRACT

A lighting device disclosed in an embodiment of the invention includes: a lighting module emitting a first light and a second light; and a lens disposed on the lighting module to block light of a shorter wavelength among the first light and the second light and transmit light of a longer wavelength, wherein the lighting module includes: a substrate; a plurality of light emitting devices disposed on the substrate and emitting a first light; a resin layer covering the plurality of light emitting devices; and a phosphor layer disposed on the resin layer to convert the first light into second light, wherein the first and second light travel through the phosphor layer in the lens direction, and the second light may pass through the lens.

20 Claims, 8 Drawing Sheets

(51) Int. Cl.
*H01L 33/50* (2010.01)
*H01L 33/52* (2010.01)
*F21S 43/10* (2018.01)

(52) U.S. Cl.
CPC ............... *H01L 33/52* (2013.01); *F21S 43/10* (2018.01); *H01L 2933/0091* (2013.01)

(58) Field of Classification Search
CPC ............... H01L 33/505; H01L 25/0753; H01L 2933/0091; H01L 23/3142; F21S 43/26; F21S 43/16; F21S 43/195; F21S 43/14; F21S 43/15; F21S 43/255; F21S 45/10; F21K 9/64; F21Y 2105/10; F21Y 2115/10; H05B 33/04
See application file for complete search history.

(56) References Cited

U.S. PATENT DOCUMENTS

| | | | |
|---|---|---|---|
| 9,333,905 B2 | 5/2016 | Nomura et al. | |
| 2002/0171911 A1* | 11/2002 | Maegawa | H01L 33/50 359/308 |
| 2004/0145913 A1 | 7/2004 | Ouderkirk et al. | |
| 2005/0212405 A1 | 9/2005 | Negley | |
| 2008/0142829 A1 | 6/2008 | Negley | |
| 2009/0147497 A1 | 6/2009 | Nada | |
| 2009/0250710 A1 | 10/2009 | Negley | |
| 2010/0149814 A1* | 6/2010 | Zhai | F21K 9/64 362/293 |
| 2011/0062478 A1 | 3/2011 | Negley | |
| 2012/0119221 A1 | 5/2012 | Negley | |
| 2013/0062637 A1* | 3/2013 | Reed | H01L 33/50 257/89 |
| 2013/0193458 A1* | 8/2013 | Mochizuki | H01L 27/15 438/27 |
| 2014/0211449 A1 | 7/2014 | Nomura et al. | |
| 2014/0264412 A1* | 9/2014 | Yoon | H01L 33/504 257/98 |
| 2014/0362885 A1* | 12/2014 | Sakuta | H01L 33/60 372/44.01 |
| 2014/0367711 A1* | 12/2014 | Bibl | H01L 24/24 257/89 |
| 2015/0048395 A1 | 2/2015 | Vampola et al. | |
| 2018/0294385 A1 | 10/2018 | Vampola et al. | |

FOREIGN PATENT DOCUMENTS

| | | |
|---|---|---|
| JP | 2005-298805 | 10/2005 |
| JP | 2011-134928 | 7/2011 |
| JP | 2014-146750 | 8/2014 |
| JP | 2016-181702 | 10/2016 |
| KR | 10-2007-0098307 | 10/2007 |
| KR | 10-2008-0076054 | 8/2008 |
| KR | 10-2009-0096638 | 9/2009 |
| KR | 10-2012-0018605 | 3/2012 |
| KR | 10-2012-0050720 | 5/2012 |
| KR | 10-2013-0062749 | 6/2013 |
| KR | 10-2014-0049274 | 4/2014 |
| WO | WO 2013/144927 | 10/2013 |

OTHER PUBLICATIONS

International Search Report dated Jul. 3, 2020 issued in Application No. PCT/KR2020/003693.
European Search Report dated Nov. 10, 2022 issued in Application No. 20777529.7.
Korean Office Action dated Feb. 18, 2022 issued in Application No. 10-2019-0112123.
Japanese Office Action dated Dec. 19, 2023, issued in Application No. 2021-553125.

* cited by examiner

LIGHTING MODULE AND LIGHTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2020/003693, filed Mar. 18, 2020, which claims priority to Korean Patent Application Nos. 10-2019-0032949, filed Mar. 22, 2019 and 10-2019-0112123, filed Sep. 10, 2019, whose entire disclosures are hereby incorporated by reference.

TECHNICAL FIELD

An embodiment of the invention relates to a lighting device including a light emitting module and a lens.

An embodiment of the invention relates to a lighting device that provides a surface light source.

BACKGROUND ART

Typical lighting applications include vehicle lights as well as backlights for displays and signage.

A light emitting device, for example, a light emitting diode (LED), has advantages such as low power consumption, semi-permanent lifespan, fast response speed, safety, and environmental friendliness compared to conventional light sources such as fluorescent lamps and incandescent lamps. Such light emitting diodes are being applied to various lighting devices such as various display devices, indoor lights or outdoor lights.

Recently, as a light source for a vehicle, a lamp employing a light emitting diode has been proposed. Compared with an incandescent lamp, a light emitting diode is advantageous in that power consumption is small. However, since the emission angle of the light emitted from the light emitting diode is small, when the light emitting diode is used as a vehicle lamp, there is a demand for increasing the light emitting area of the lamp using the light emitting diode. In addition, since the light emitting diode has a small size, it is possible to increase the design freedom of the lamp, and it is economical due to a semi-permanent life.

In a conventional lighting module for a vehicle, a high-density phosphor layer is disposed on a light emitting device to form a uniform surface light source. Light emitted from the light emitting device is reflected or absorbed by the high-density phosphor layer disposed to form a uniform surface light source, resulting in a problem in that the light extraction efficiency of the lighting module is lowered, and when a low-density phosphor layer is disposed in order to prevent a decrease in the light extraction efficiency of the lighting module, it is difficult to form a uniform surface light source.

DISCLOSURE

Technical Problem

The embodiment may provide a lighting device that prevents reduction in light loss due to the phosphor layer and improves visibility.

The embodiment may provide a lighting device capable of improving light extraction efficiency of a lighting module and realizing a uniform surface light source by a lens disposed on a phosphor layer.

Technical Solution

According to an embodiment of the invention, a lighting device includes a lighting module for emitting a first light and a second light; and a lens disposed on the lighting module to block light of a shorter wavelength among the first light and the second light and transmit light of a longer wavelength, wherein the lighting module includes: a substrate; a plurality of light emitting devices disposed on the substrate and emitting the first light; a resin layer covering the plurality of light emitting devices; and a phosphor layer disposed on the resin layer to convert the first light into the second light, wherein the first and second light travel through the phosphor layer in the lens direction, and the second light may pass through the lens.

According to an embodiment of the invention, the lens is a red lens, and may be disposed to be spaced apart from the phosphor layer by a predetermined distance.

According to an embodiment of the invention, the lens may be a red lens, and a lower surface of the lens may be in contact with an upper surface of the phosphor layer.

According to an embodiment of the invention, the lens may include a first lens disposed on the phosphor layer and a second lens disposed on the first lens.

According to an embodiment of the invention, the second lens may be disposed to be spaced apart from the first lens by a predetermined distance.

According to an embodiment of the invention, the lower surface of the second lens may be in contact with the upper surface of the first lens.

According to an embodiment of the invention, the first lens may be a red lens, and the second lens may be a transparent lens.

According to an embodiment of the invention, the phosphor content of the phosphor layer may be 2% or more and 10% or less with respect to a weight of the phosphor layer.

According to an embodiment of the invention, an optical efficiency of the first light and the second light passing through the phosphor layer may be 170% to 210% of an optical efficiency of the second light passing through the lens.

Advantageous Effects

In the lighting device according to the embodiment, a lens disposed on the phosphor layer transmits red light and reflects blue light to improve visibility of the lighting module.

The lighting device according to the embodiment may reduce the phosphor content by a lens disposed on the phosphor layer, thereby preventing light loss due to the phosphor layer and providing a uniform surface light source.

BEST MODE

Figure 1:
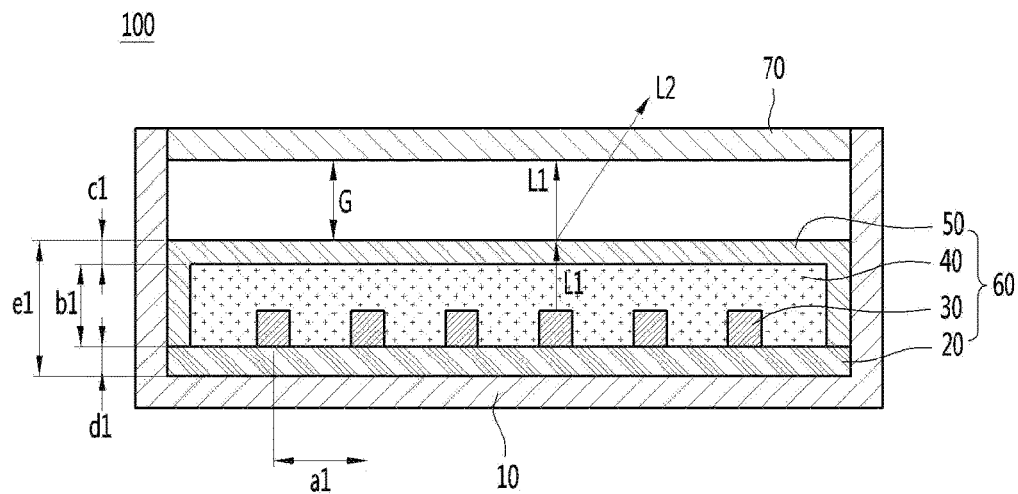
FIG. 1 is a cross-sectional view of a lighting device according to an embodiment.

Hereinafter, preferred embodiments of the invention will be described in detail with reference to the accompanying drawings.

A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention.

In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component.

In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to a variety of lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

Figure 2:
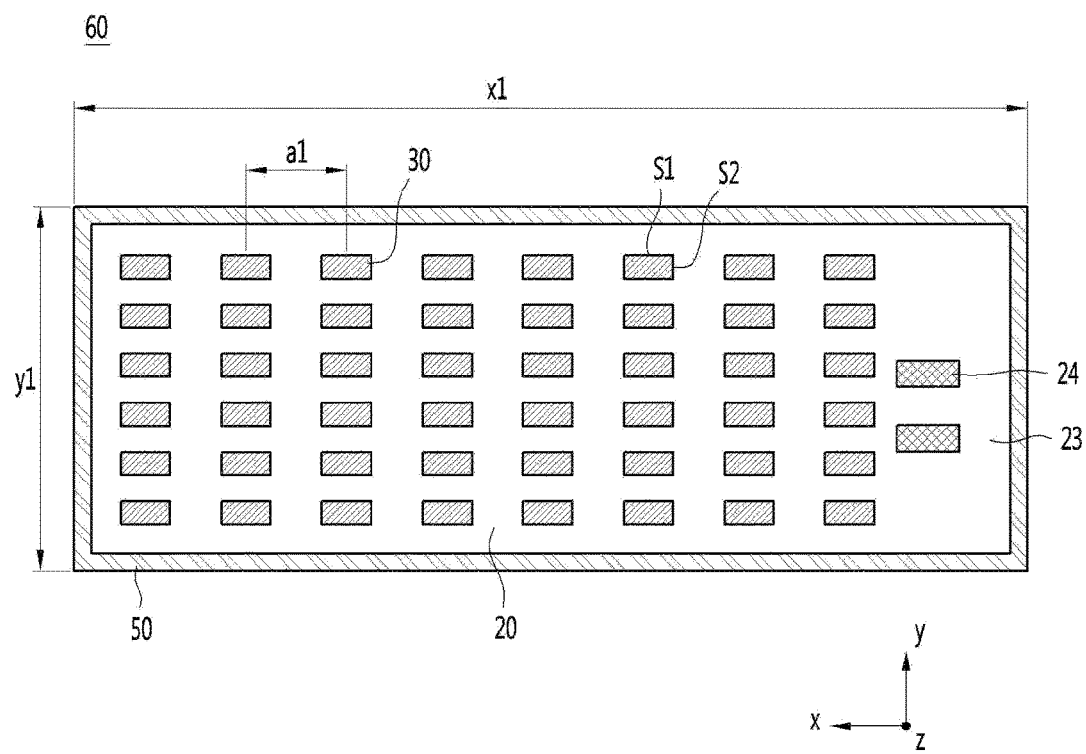
FIG. 2 is a plan view of a light emitting module according to an embodiment.

FIG. 1 is a cross-sectional view illustrating a lighting device according to an embodiment, and FIG. 2 is a cross-sectional view of a light emitting module according to the embodiment.

As shown in FIGS. 1 and 2, the lighting device 100 may include a housing 10, a lighting module 60 coupled to the housing 10, and an outer lens 70. The lighting module 60 may include a substrate 20, a plurality of light emitting devices 30 disposed on the substrate 20, a connector 24 for supplying power to the light emitting device 30, and the light emitting device 30, and a resin layer 40 covering the light emitting device 30, and a phosphor layer 50 disposed on the resin layer 40. The outer lens 70 may be disposed on the phosphor layer 50.

The housing 10 may be disposed to surround a side surface of the lighting module 60 and coupled to the lighting module 60.

The lighting module 60 may emit the light emitted from the light emitting device 30 as a surface light source. The plurality of the light emitting devices 30 may be disposed on the substrate 20. In the lighting device 100, the plurality of light emitting devices 30 may be arranged in N columns (N is an integer greater than or equal to 1) and/or M rows (M is an integer greater than or equal to 1). The plurality of light emitting devices 30 may be arranged in N columns and M rows (N and M are integers greater than or equal to 2) as shown in FIG. 2.

As shown in FIGS. 1 and 2, the substrate 20 may function as a base member or a support member positioned under the plurality of light emitting devices 30 and the resin layer 40. The substrate 20 may include a printed circuit board (PCB). For example, the substrate 20 may include at least one of a resin-based printed circuit board (PCB), a metal core PCB, a flexible PCB, a ceramic PCB, or an FR-4 substrate.

The upper surface of the substrate 20 may have an X-Y axis plane, and the thickness dl of the substrate 20 may be a height in the Z direction orthogonal to the X direction and the Y direction. Here, the X direction may be a first direction, the Y direction may be a second direction orthogonal to the X direction, and the Z direction may be a third direction orthogonal to the X direction and the Y direction.

The substrate 20 includes a wiring layer (not shown) thereon, and the wiring layer may be electrically connected to the light emitting device 30. A reflective member or a protective layer disposed on the substrate 20 may protect the wiring layer. The plurality of light emitting devices 30 may be connected in series, parallel, or series-parallel by a wiring layer of the substrate 20. In the plurality of light emitting devices 30, groups having two or more light emitting devices may be connected in series or in parallel, or between the groups may be connected in series or in parallel.

The length x1 in the first direction (X direction) and the length y1 in the second direction (Y direction) of the substrate 20 may be different from each other, for example, the length x1 in the first direction may be arranged longer than the length y1 in the second direction. The length x1 in the first direction may be greater than or equal to twice the length x1 in the second direction. The thickness dl of the substrate 20 may be 1.0 mm or less, for example, in the range of 0.3 mm to 1.0 mm. Since the thickness dl of the substrate 20 is provided to be thin, the thickness of the lighting module may not be increased. Since the substrate 20 has a thickness dl of 1.0 mm or less, it may support a flexible module. The thickness dl of the substrate 20 may be less than or equal to 0.1 times the distance from the lower surface of the substrate 20 to the upper surface of the uppermost layer, or may be in the range of 0.1 times to 0.06 times. A distance from the lower surface of the substrate 20 to the upper surface of the uppermost layer may be the thickness dl of the substrate 20.

The interval from the lower surface of the substrate 20 to the upper surface of the phosphor layer 50, which is the uppermost layer, may be the thickness e1 of the lighting module 60. The thickness e1 of the lighting module 60 may be ⅓ or less of the shorter length among the lengths x1 and y1 in the first direction (X direction) and the second direction (Y direction) of the substrate 20, but not limited thereto. The thickness e1 of the lighting module 60 may be 6 mm or less from a bottom of the substrate 20, or may be in the range of 4 mm to 6 mm. The thickness e1 of the lighting module 60 may be 200% or less, for example, 120% to 200% of the thickness b1 of the resin layer 40. Since the lighting module 60 has a thickness e1 of 4 mm-6 mm, it may be provided as a flexible and slim surface light source module.

When the thickness e1 of the lighting module 60 is thinner than the above range, the light diffusion space may be reduced and a hot spot may be generated. The embodiment provides a thickness e1 of the lighting module 60 of 6 mm or less, so that it is provided as a module capable of a curved structure, thereby reducing design freedom and spatial constraints. The ratio of the length y1 in the Y direction of the lighting module 60 to the thickness of the lighting module 60 may be 1:m, and may have a ratio relationship of m≥1, wherein m is a natural number of at least 1, the column of the light emitting device 30 may be an integer smaller than m. For example, when the m is greater than four times the thickness e1 of the lighting module 60, the light emitting devices 30 may be arranged in four columns.

The substrate 20 may include a connector 24 in a portion thereof to supply power to the plurality of light emitting devices 30. A region 23 in which the connector 24 is disposed of the substrate 20 is a region in which the resin layer 40 is not formed, and may be equal to or smaller than the length y1 in the Y direction of the substrate 20. The connector 24 may be disposed on a part of an upper surface or a part of a lower surface of the substrate 20. When the connector 24 is disposed on the lower surface of the substrate 20, the region 23 may be removed. The substrate 20 may have a top view shape of a rectangle, a square, or other polygonal shapes, and may have a bar shape having a curved shape. The connector 24 may be a terminal connected to the light emitting device 30 or a female connector or a male connector.

The substrate 20 may include a protective layer or a reflective layer thereon. The protective layer or the reflective layer may include a member having a solder resist material, and the solder resist material is a white material and may reflect incident light.

As another example, the substrate 20 may include a transparent material. Since the substrate 20 made of the transparent material is provided, the light emitted from the light emitting device 30 may be emitted in the upper surface direction and the lower surface direction of the substrate 20. In this case, the light emitted toward the lower surface of the substrate 20 may be reflected from the inner surface of the housing 10 and guided toward the outer lens 70.

The light emitting device 30 may be disposed on the substrate 20. The light emitting device 30 has a light emitting surface 51 and a plurality of side surfaces S2, and the light emitting surface 51 may face the upper surface of the phosphor layer 50 and may emit light toward the phosphor layer 50. The light emitting surface 51 is the upper surface of the light emitting device 30, and most of the light is emitted. The plurality of side surfaces S2 includes at least four side surfaces and emits light in a lateral direction of the light emitting device 30. The light emitting device 30 is an LED chip that emits light on at least five sides, and may be disposed on the substrate 20 in a flip chip type. The light emitting device 30 may be formed to a thickness of 0.3 mm or less.

As another example, the light emitting device 30 may be implemented as a horizontal chip or a vertical chip. In the case of the horizontal type chip or the vertical type chip, it may be connected to another chip or a wiring pattern by a wire. When a wire is connected to the LED chip, the thickness of the diffusion layer may be increased due to the height of the wire, and the distance between the light emitting devices 30 may be increased due to a connection space according to the length of the wire. In the light emitting device 30 according to the embodiment, a distribution of the angle of beam spread may be increased by emitting light from five sides. The light emitting device 30 may be disposed on the substrate 20 as a flip chip. The interval a1 between the light emitting devices 30 may be equal to or greater than the thickness b1(b1≤a1) of the resin layer 40. The interval a1 includes a range of 4 mm-7 mm, and may be, for example, in a range of 6.5 mm to 8 mm, and may vary depending on the size of the LED chip. The minimum interval between the light emitting devices 30 may be equal to or greater than the thickness b1 of the resin layer 40.

Since the light emitting device 30 disclosed in the embodiment is provided as a flip chip that emits light on at least five sides, the luminance distribution and the distribution of angle of beam spread of the light emitting device 30 may be improved.

When the light emitting devices 30 are arranged in an N×M matrix on the substrate 20, N may be one or more columns or two or more, and M may be one or more rows or two rows. The N and M are integers of 1 or more. The light emitting devices 30 may be arranged in Y-axis and X-axis directions, respectively.

The light emitting device 30 is a light emitting diode (LED) chip, and may emit at least one of blue, red, green, ultraviolet (UV), and infrared rays. The light emitting device 30 may emit, for example, at least one of blue, red, and green. The light emitting device 30 may be electrically connected to the substrate 20, but is not limited thereto.

The plurality of light emitting devices 30 disposed on the substrate 20 may be sealed by the resin layer 40. The plurality of light emitting devices 30 may be in contact with the resin layer 40. The resin layer 40 may be disposed on a side surface and an upper surface of the light emitting device 30. The light emitted from the light emitting device 30 may be emitted through the resin layer 40. The light emitted from the light emitting device 30 may be emitted to the outside through the resin layer 40 and the phosphor layer 50 disposed on the resin layer 40. The thickness b1 of the resin layer 40 may be thinner than the thickness e1 of the lighting module 60, or may be greater than the thickness d1 of the substrate 20 and the thickness c1 of the phosphor layer 50. For example, the thickness b1 of the resin layer 40 may be in a range of 3 mm to 5 mm.

The resin layer 40 may be made of a transparent resin material, for example, a resin material such as UV (ultra violet) resin, silicone, or epoxy. The resin layer 40 may be a diffusion layer without a diffusion agent or a molding layer. The UV resin may be, for example, a resin (oligomer type) containing a urethane acrylate oligomer as a main material. For example, it is possible to use a synthetic oligomer urethane acrylate oligomer. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

A phosphor layer 50 may be disposed on the resin layer 40. The phosphor layer 50 may be disposed to cover an upper surface of the resin layer 40. The phosphor layer 50 disposed on the resin layer 40 may extend to a side surface of the resin layer 40. The phosphor layer 50 may surround the side surface of the resin layer 40. The phosphor layer 50 extending to the side surfaces of the resin layer 40 may be in contact with the upper surface of the substrate 20. The outer lower end of the phosphor layer 50 may be in contact with the upper surface of the substrate 20. The thickness c1 of the phosphor layer 50 may be 0.5 mm to 1 mm. The phosphor content of the phosphor layer 50 may be a phosphor content relative to the weight of the phosphor layer 50. The phosphor content of the phosphor layer 50 may be 2% to 10% based on the weight of the phosphor layer 50. For example, when the phosphor content of the phosphor layer 50 is less than 2% by weight of the phosphor layer 50, a hot spot phenomenon may occur in the lighting module 60 and the amount of wavelength-converted light may be reduced. When the phosphor content of the phosphor layer 50 is 10% or more based on the weight of the phosphor layer 50, the light absorbed or reflected by the phosphor layer 50 may be increased, so that the light extraction efficiency of the lighting module 60 may be lowered. The first light L1 emitted from the light emitting device 30 may be diffused by the resin layer 40 and then converted into the second light L2 by the phosphor included in the phosphor layer 50. In addition, the first light L1 emitted from the light emitting device 30 may be diffused by the resin layer 40 and pass through the phosphor layer 50. Accordingly, the first light L1 emitted from the light emitting device 30 may be converted to the second light L2 by the phosphor layer 50 or the first light L1 passed through the phosphor layer 50 may be traveled to the outer lens 70. Since the phosphor layer 50 has a low content of 2% to 10% based on the weight of the phosphor layer 50, light reflected or absorbed by the phosphor layer 50 may be reduced. Accordingly, since the amount of light passing through the phosphor layer 50 or converted by the phosphor layer 50 increases, the light extraction efficiency of the lighting module 60 may be improved. In addition, since the phosphor layer 50 has a low content, the light reflected or absorbed by the phosphor layer 50 is reduced, the amount of light passing through the phosphor layer 50 is increased, and the interval between the adjacent light emitting devices 30 is increased. The interval a1 may be improved to 4 mm-6 mm to 7 mm-8 mm and the number of light emitting devices 30 disposed on the substrate 20 may be reduced.

The phosphor layer 50 may include a transparent material. The phosphor layer 50 may include a transparent insulating material. The phosphor layer 50 may be made of silicon, and may be made of silicon having different chemical bonds. For example, silicon is a polymer in which silicon as an inorganic substance and carbon as an organic substance are combined, and has physical properties such as thermal stability, chemical stability, abrasion resistance, and glossiness of inorganic substances and reactivity, solubility, elasticity, and processability, which are characteristics of organic substances. Silicone may include general silicone, and fluorine silicone with an increased fluorine ratio. Increasing the fluorine ratio of fluorine silicone has an effect of improving moisture-proof properties.

The phosphor layer 50 may include a wavelength conversion means for receiving light emitted from the light emitting device 30 and providing wavelength-converted light. For example, the phosphor layer 50 may include at least one selected from the group consisting of phosphors, quantum dots, and the like. The phosphor or quantum dots may emit blue, green, or red light.

The phosphor may be uniformly disposed in the phosphor layer 50. The phosphor may include a phosphor of a fluoride compound, for example, may include at least one of an MGF-based phosphor, a KSF-based phosphor, or a KTF-based phosphor.

When the phosphor is a red phosphor, the red phosphor may have a wavelength range of 610 nm to 650 nm, and the wavelength may have a width of less than 10 nm. The red phosphor may include a fluoride-based phosphor.

An outer lens 70 may be disposed on the phosphor layer 50. The outer lens 70 may be coupled to the housing 10. The housing 10 may be disposed on a side surface of the outer lens 70 so that the outer lens 70 and the housing 10 may be coupled to each other. The outer lens 70 may be disposed to be spaced apart from the upper surface of the phosphor layer 50 with a predetermined gap G. The outer lens 70 may serve to irradiate the light emitted from the lighting module 60 by concentrating it in all directions or dispersing it in the opposite direction. The outer lens 70 may be a lens of a red color. The outer lens 70 may be formed of a material of polymethylmethacrylate (PMMA) or polycarbonate (PC). In the lighting device 100 according to the embodiment, the phosphor layer 50, the outer lens 70, the phosphor layer 50 and the outer lens 70 having different refractive indices of light emitted from the lighting module 60. By passing the gap G between the light extraction efficiency to the outside may be improved. In addition, the first light L1 emitted from the light emitting device 30 and passing through the phosphor layer 50 is absorbed or reflected by the outer lens 70, and the second light L2 in which the first light L1 emitted from the light emitting device 30 is converted by the phosphor layer 50 may passes through the outer lens 70, thereby preventing a peak that may be generated by the first light L1. In addition, a hot spot phenomenon generated by the phosphor layer 50 having a low density may be prevented by the outer lens 70.

In a conventional vehicle lighting module, when a low-density phosphor layer is disposed on a light emitting device, it is difficult to form a uniform surface light source. In order to solve this problem, a high-density phosphor layer is disposed on the light emitting device. However, when a high-density phosphor layer is disposed on the light-emitting device, light emitted from the light emitting device is reflected or absorbed by the high-density phosphor layer, resulting in a new problem in that the light extraction efficiency of the lighting module is lowered. In the embodiment, a uniform surface light source may be formed even when the low-density phosphor layer 50 is disposed on the light emitting device, and when the low-density phosphor layer 50 is disposed, the light extraction efficiency is prevented from being lowered and uniform surface light source is formed. It is possible to provide the lighting device 100 that forms a uniform surface light source and has improved light extraction efficiency.

In the lighting device 100 according to the embodiment, since the phosphor content of the phosphor layer 50 includes a low content of 2% to 10% relative to the weight of the phosphor layer 50, the light extraction efficiency of the lighting module 60 may be improved, a hot spot phenomenon may be prevented and a uniform surface light source may be formed by the outer lens 70 disposed on the phosphor layer 50. In addition, in the lighting device 100 according to the embodiment, the light emitted from the light emitting device 30 is emitted to the outside through the phosphor layer 50, the outer lens 70, and a gap G between the phosphor layer 50 and the outer lens 70 having different refractive indices, thereby improving the light extraction efficiency of the lighting device 100.

Figure 3:
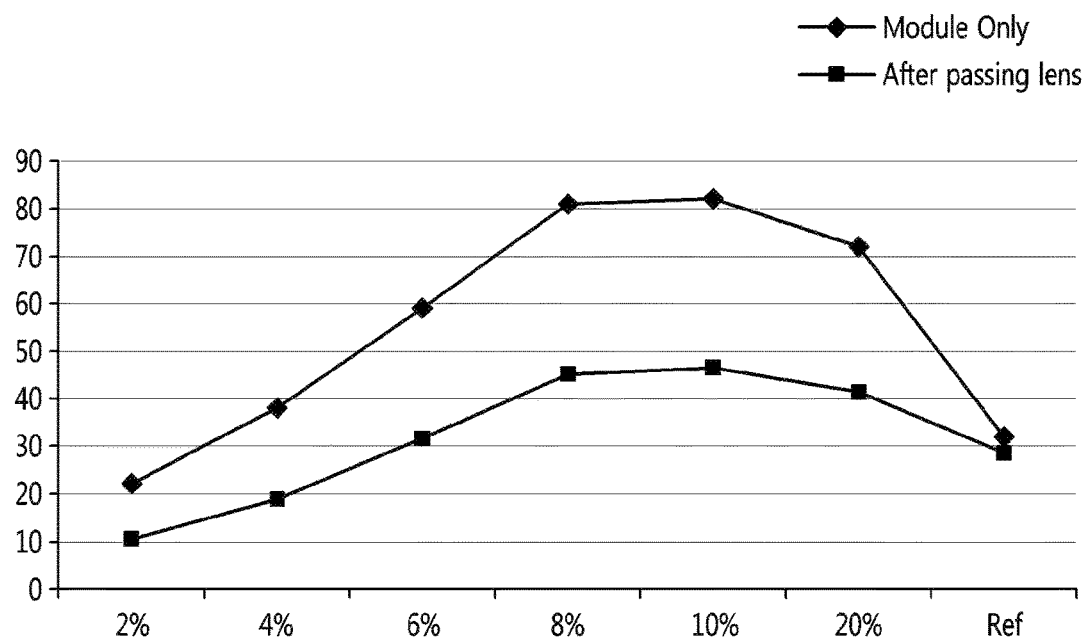
FIG. 3 is a view showing an amount of light according to the phosphor content of the lighting device according to the embodiment.

FIG. 3 is a diagram illustrating light efficiency according to phosphor content of lighting devices according to the Embodiment and Comparative Examples Ref. Referring to Table 1 and FIG. 3, it may be seen that the luminous efficiency emitted from the lighting devices of Comparative Example and Embodiment.

TABLE 1

| Phosphor content (%) | 2 | 4 | 6 | 8 | 10 | 20 | Ref |
|---|---|---|---|---|---|---|---|
| Module-Luminous Efficiency(lm/W) | 22 | 38 | 59 | 81 | 82 | 72 | 32 |
| Lens-Luminous Efficiency(lm/W) | 11 | 19 | 32 | 45 | 47 | 42 | 29 |

Here, the luminous efficiency of the module is a luminous efficiency measured when the light emitted from the light emitting device passes through the resin layer 40 and the phosphor layer 50, and the luminous efficiency of the lens is a luminous efficiency measured when the light emitted from the light emitting device of the lighting device passes through the resin layer 40, the phosphor layer 50 and the outer lens 70, and the Comparative Example (Ref) is a luminous efficiency measured when light emitted from the light emitting device of the lighting device passes through the resin layer, the phosphor layer containing 20% content, and the ink layer.

In Table 1, comparing the case where Ref and the phosphor content is 20% based on the weight of the phosphor layer 50, in the Comparative Example of Ref, the luminous efficiency measured for the light emitted from the light emitting device and transmitted through the resin layer, the phosphor layer, and the ink layer is 32 lm/W, and after the transmission of the lens, the luminous efficiency measured through the resin layer. When the phosphor content in the light emitting device of the Embodiment is 20% based on the weight of the phosphor layer 50, the luminous efficiency measured for the light emitted from the light emitting device and transmitted through the resin layer 40 and the phosphor layer 50 is 72 lm/W, the luminous efficiency measured by passing through the outer lens 70 after transmitting the phosphor layer 50 is 42 lm/W. Therefore, it can be seen that the light extraction efficiency is greatly reduced when the light emitted from the light emitting device of the lighting device passes through the ink layer.

And, when the phosphor content of the phosphor layer 50 of the Embodiment is 2% or more and 10% or less relative to the weight of the phosphor layer 50, it can be seen that the amount of light emitted from the light emitting device and measured from the outside gradually increases. Next, when the phosphor content of Comparative Example and Embodiment is 10% or more based on the weight of the phosphor layer 50, it can be seen that the light efficiency measured from the outside is reduced by being emitted from the light emitting device. Accordingly, in the lighting device according to the embodiment, when the phosphor content of the phosphor layer 50 is 2% or more and 10% or less based on the weight of the phosphor layer 50, light reflected or absorbed by the phosphor layer 50 is reduced. Thus, it is possible to reduce light loss due to the phosphor layer 50. The phosphor content of the phosphor layer 50 may be in the range of 6% to 10%.

And, when the phosphor content is 2% or more and 10% or less based on the weight of the phosphor layer 50, comparing the Comparative Example and Embodiment, the luminous efficiency measured after the light emitted from the light emitting device of the lighting device passes through the resin layer 40 and the phosphor layer 50 may have a value of 170% to 210 more than the measured luminous efficiency obtained by passing the resin layer 40, the phosphor layer 50, and the outer lens 70.

Figure 4:
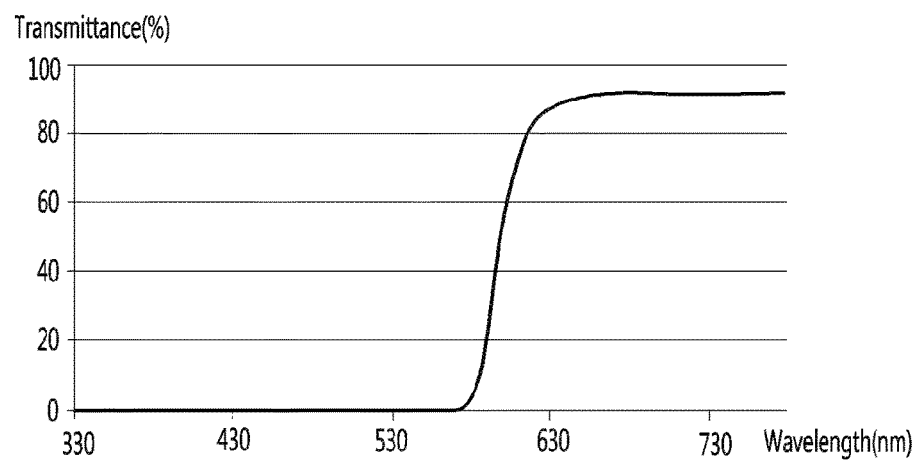
FIG. 4 is a view illustrating transmittance according to a wavelength of an outer lens of a lighting apparatus according to an embodiment.

FIG. 4 is a diagram illustrating transmittance according to a wavelength of an outer lens. As shown in FIG. 4, the outer lens 70 has a transmittance within 5% in the blue wavelength region, for example, 420-480 nm, so that most of the blue light is not transmitted, and has a transmittance that is gradually increases in the red wavelength region, for example, 590-750 nm, and may transmit most of the red light. Accordingly, a peak may generate in the wavelength region (blue) of the first light L1 emitted from the light emitting device 30 by the low-density phosphor layer 50 of the lighting device 100 according to the embodiment. However, the outer lens 70 passes through the phosphor layer 50 and does not transmit the first light L1 directed to the outer lens 70, but the outer lens 70 transmits only the second light L2 converted by the phosphor layer 50 to prevent the occurrence of a blue peak caused by the low-density phosphor layer 50 and improve light extraction efficiency.

Figure 5:
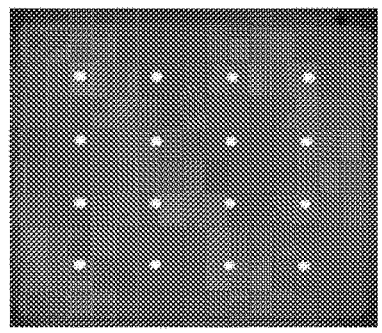
FIGS. 5 and 6 are diagrams illustrating a plan view of a lighting device according to a comparative example and intensity according to wavelength.
Figure 6:
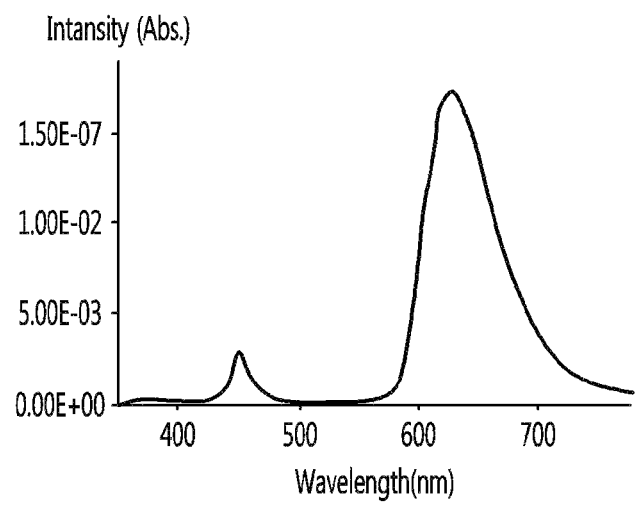
Figure 7:
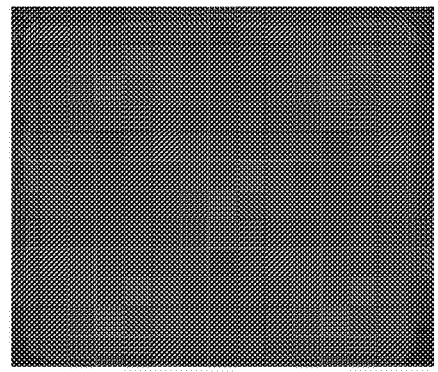
FIGS. 7 and 8 are a plan view of a lighting device according to an embodiment and a diagram illustrating intensity according to wavelength.
Figure 8:
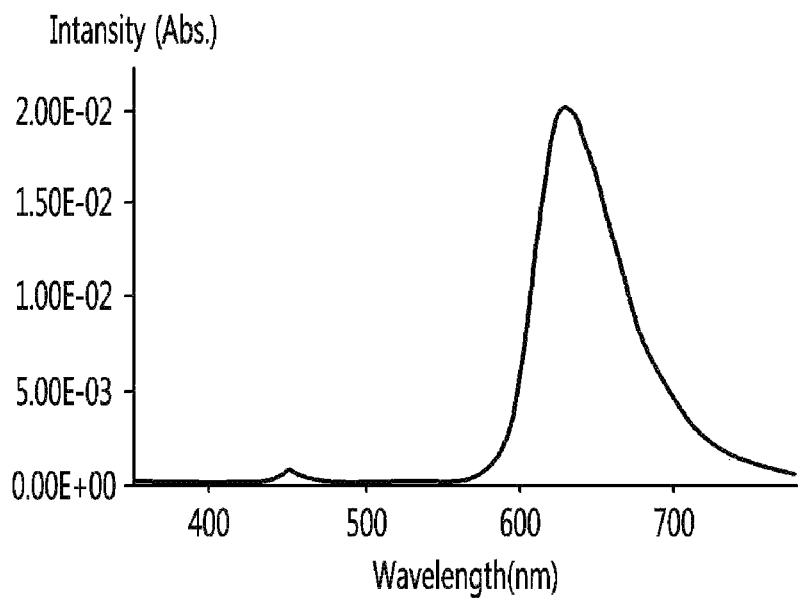

FIGS. 5 and 6 are views showing a plan view and intensity according to wavelength of a lighting device in Comparative Example without a low-density phosphor layer and an outer lens, and FIGS. 7 and 8 are views showing a plan view and intensity according to wavelength of the lighting device in the Embodiment with a low-density phosphor layer and an outer lens. Comparing FIGS. 5 and 6, and 7 and 8, as shown in FIG. 5, in the lighting device according to the Comparative Example, a hot spot phenomenon occurred using a low-density phosphor layer, but as shown in FIG. 7, in the lighting device according to the embodiment, a hot spot phenomenon did not occur even when a low-density phosphor layer was used, and visibility was improved compared to the lighting device according to the Comparative Example.

In addition, as shown in FIG. 6, in the lighting device according to the Comparative Example, some intensity of light in the blue wavelength region exists, but as shown in FIG. 8, in the lighting device according to the Embodiment, as shown in FIG. 8, it may be seen that in the lighting device according to the embodiment, the intensity of light in the blue wavelength region is decreased compared to the comparative example.

Figure 9:
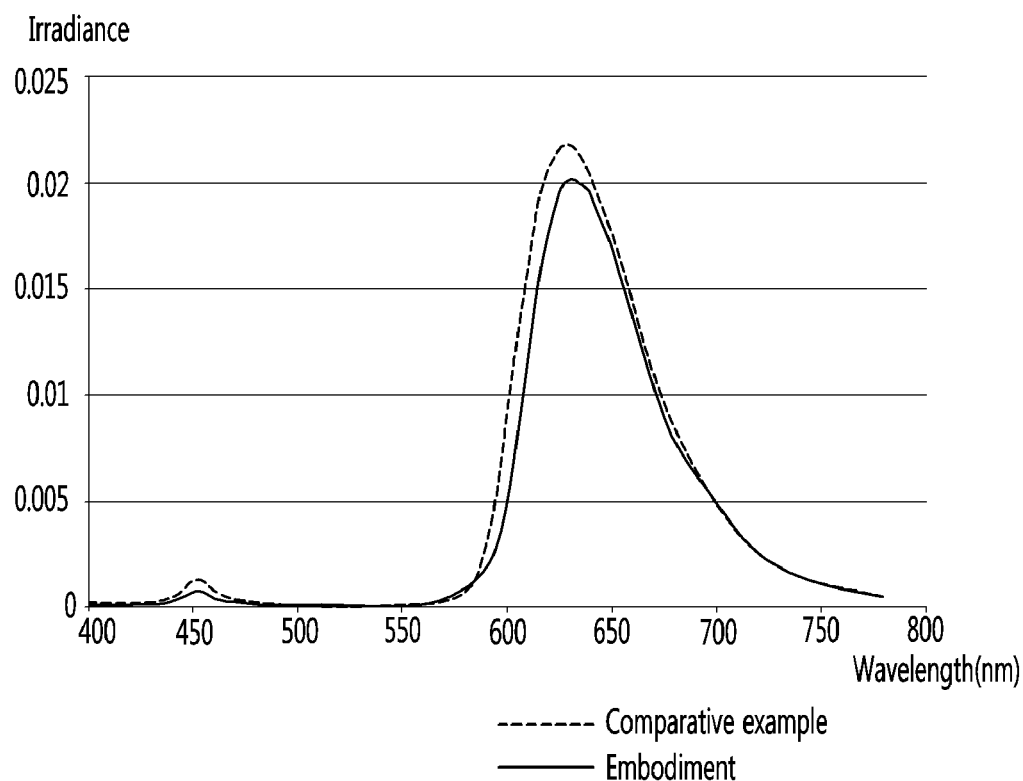
FIG. 9 is a diagram illustrating irradiance according to wavelengths of embodiment and comparative examples.

FIG. 9 is a diagram illustrating irradiance according to wavelengths of lighting devices according to Comparative Example 2 (dotted line) and Embodiment (solid line). Results of Embodiment and Comparative Example 2 of irradiance according to wavelengths shown in FIG. 9 may be described with reference to Table 2.

TABLE 2

|  | Wavelength (nm) | | | | |
| --- | --- | --- | --- | --- | --- |
|  | 450 | 550 | 625 | 650 | 750 |
| Comparative Example 2 | 0.001267 | 7.06E−05 | 0.02162 | 0.017646 | 0.00116 |
| Embodiment | 0.000708 | 6.43E−05 | 0.019663 | 0.01659 | 0.001136 |
| Decrease rate | 44.1% | 8.8% | 9.1% | 6.0% | 2.1% |

Referring to Table 2, in the blue wavelength region, for example, in the region of about 450 nm, it may be seen that the irradiance of the lighting device according to the Embodiment including the outer lens 70 is further reduced by 44.1% than the irradiance of the lighting device according to Comparative Example 2 that does not include the outer lens. It is possible to prevent a peak from occurring in the blue wavelength region due to 44.1% reduction in illuminance in the blue wavelength region by the outer lens 70.

And, in the red wavelength region, for example, in the 590 nm to 750 nm region, it may be seen that the irradiance of the lighting device according to the Embodiment including the outer lens 70 is further reduced by 6.0% and 2.1%, respectively, than the irradiance of the lighting device according to Comparative Example 2 that does not include the outer lens. Accordingly, in the lighting device including the outer lens 70 of the embodiment, the outer lens 70 absorbs blue light to prevent a peak from occurring in the blue wavelength region, and transmits the red light without absorbing it, thereby preventing a decrease in the extraction efficiency of red light by the outer lens.

Figure 10:
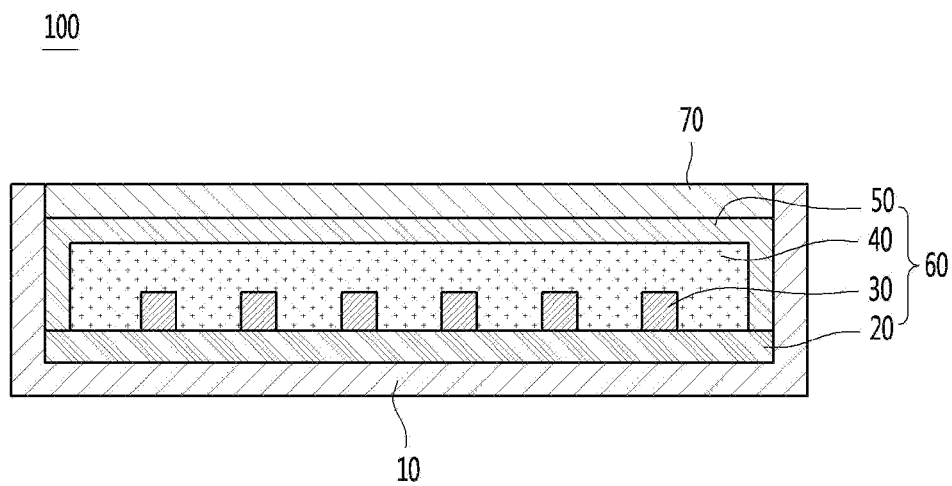
FIG. 10 is a cross-sectional view according to a modified example of the lighting device according to the embodiment.

Next, FIG. 10 is a view showing a modified example of the lighting device according to the embodiment. In FIG. 10, the content previously described in the lighting device according to the embodiment shown in FIGS. 1 to 9 may be adopted.

The lighting device 100 may include a lighting module 60 and an outer lens 70 coupled to the housing 10. The outer lens 70 may cover the entire upper surface of the phosphor layer 50. A lower surface of the outer lens 70 may contact an upper surface of the phosphor layer 50.

The lighting device 100 according to the embodiment shown in FIG. 10 may include an outer lens 70 contacting the upper surface of the phosphor layer 50. Accordingly, the outer lens lens 70 and the phosphor layer 50 may be combined with the housing 10 without forming a gap, thereby reducing the size of the lighting device 100 to increase design freedom.

Figure 11:
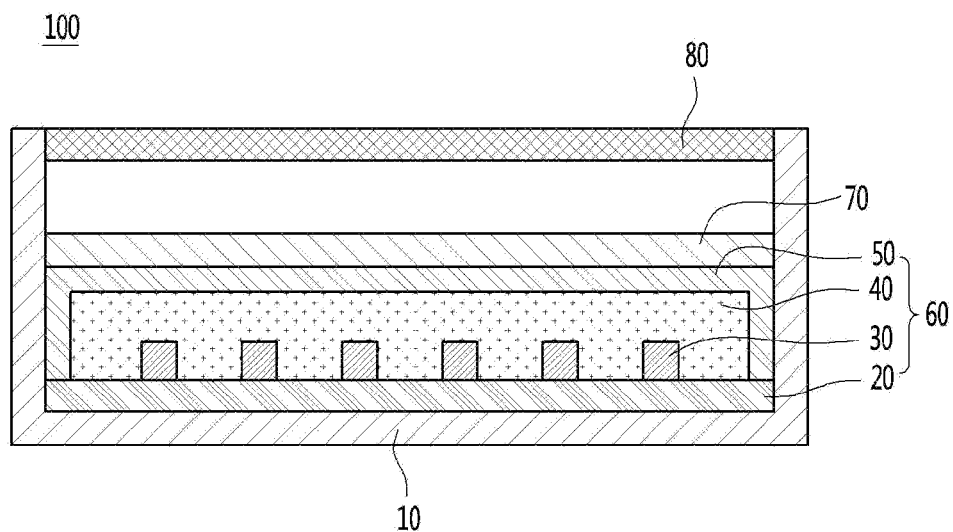
FIG. 11 is a cross-sectional view according to a modified example of the lighting device according to the embodiment.

Next, FIG. 11 is a view showing a modified example of the lighting device according to the embodiment. In FIG. 11, the content previously described in the lighting device according to the embodiment shown in FIGS. 1 to 9 may be adopted.

The lighting device 100 may include a lighting module 60 coupled to the housing 10, an inner lens 70, and an outer lens 80. The inner lens 70 may contact the upper surface of the phosphor layer 50. The outer lens 80 may be disposed on the inner lens 70. The inner lens 70 may be disposed to be spaced apart from the outer lens 80 with a predetermined gap G. The inner lens 70 may be a red lens. The outer lens 80 may be formed of a transparent material.

In the lighting device 100 according to the embodiment shown in FIG. 11, the light emitted from the lighting module 60 may be emitted to the outside the inner lens 70, the outer lens 80 disposed with a gap at a predetermined interval on the inner lens 70, and the gap G between the inner lens 70 and the outer lens 80. Accordingly, since the light emitted from the lighting module 60 is emitted to the outside through the inner lens 70, the outer lens 80, and the gap G between the inner lens 70 and the outer lens 80 having different refractive indices, the light extraction efficiency of the lighting device 100 may be improved.

Figure 12:
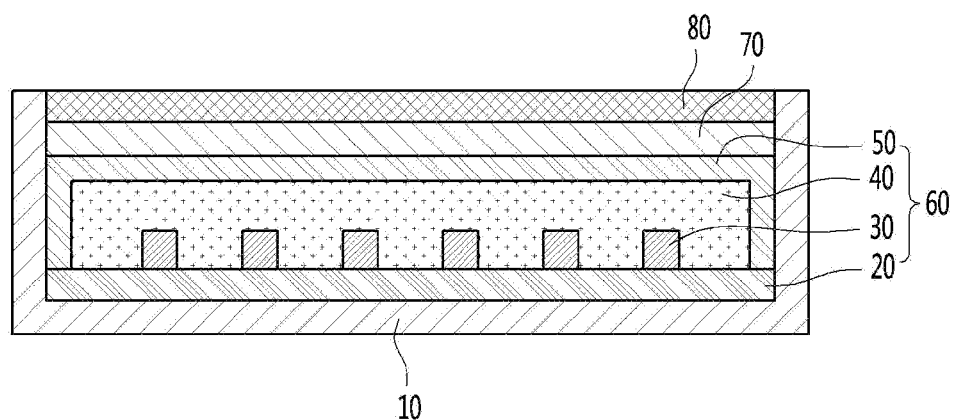
FIG. 12 is a cross-sectional view according to a modified example of the lighting device according to the embodiment.

Next, FIG. 12 is a view showing a modified example of the lighting device according to the embodiment. In FIG. 12, the content previously described in the lighting device according to the embodiment shown in FIGS. 1 to 9 may be adopted.

The lighting device 100 may include a lighting module 60 coupled to the housing 10, an inner lens 70, and an outer lens 80. The inner lens 70 may cover the entire upper surface of the phosphor layer 50. The inner lens 70 may contact the upper surface of the phosphor layer 50. The outer lens 80 may be disposed on the inner lens 70. The outer lens 80 may cover the entire upper surface of the inner lens 70. A lower surface of the outer lens 80 may contact an upper surface of the inner lens 70. The inner lens 70 may be a red lens. The outer lens 80 may be formed of a transparent material.

The lighting device 100 according to the embodiment shown in FIG. 12 may include an inner lens 70 and an outer lens 80 contacting an upper surface of the inner lens 70. In addition, the light emitted from the lighting module 60 may pass through the outer lens 80 and the inner lens 70 to be emitted to the outside. Accordingly, the inner lens 70 and the outer lens 80 may be combined with the housing 10 without forming a gap, thereby reducing the size of the lighting device 100 to increase design freedom, and since the light emitted from the lighting module 60 may pass through the inner lens 70 and the outer lens 80 having different refractive indices, the light extraction efficiency of the lighting device 100 may be improved.

Figure 13:
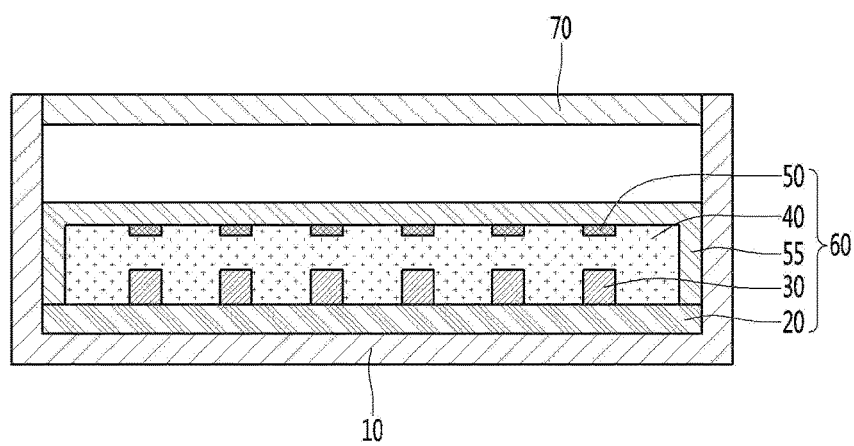
FIG. 13 is a cross-sectional view according to a modified example of the lighting device according to the embodiment.

FIG. 13 is a diagram illustrating a modified example of a lighting device according to an embodiment. In FIG. 13, the content previously described in the lighting device according to the embodiment shown in FIGS. 1 to 9 may be adopted.

As shown in FIG. 13, a modified example of the lighting device according to the embodiment may include a housing 10, a lighting module 60 including a substrate 20, a light emitting device 30, a resin layer 40, a diffusion layer 55, and a phosphor layer 50, and a lens 70.

Referring to FIG. 13, a diffusion layer 55 may be disposed on the resin layer 40. The diffusion layer 55 may be disposed to surround the side and upper surfaces of the resin layer 40. The diffusion layer 55 may be disposed to cover the resin layer 40. The diffusion layer 55 may be disposed on the resin layer 40. The diffusion layer 55 may be attached on the resin layer 40 by applying a predetermined pressure or pressure/heat. Since the diffusion layer 55 is adhered by the self-adhesive force of the resin layer 40 without a separate adhesive, the process of separately attaching the adhesive may be reduced, and the use of an adhesive harmful to the human body may be avoided, thereby reducing process or material waste may be reduced The diffusion layer 55 may be adhered to the entire upper surface of the resin layer 40. Since a specific color may not be mixed when the luminous intensity of light is high, the diffusion layer 55 may diffuse and mix the lights. The material of the diffusion layer 55 may be a light-transmitting material. For example, the diffusion layer 55 may include at least one of a polyester (PET) film, a poly methyl methacrylate (PMMA) material, or a polycarbonate (PC) material. The diffusion layer 55 may be provided as a film made of a resin material such as silicone or epoxy. The diffusion layer 55 may include a single layer or multiple layers.

In addition, the phosphor layer 50 may be adhered to the lower surface of the diffusion layer 55 in a patterned shape. The phosphor layer 50 may have a shape of a triangle, a square, or a circle, but is not limited thereto. The phosphor layer 50 may be disposed to correspond to the light emitting device 30. The phosphor layer 50 may be disposed to overlap the light emitting device 30 in a vertical direction. The color of the phosphor included in the phosphor layer 50 and the color of the lens 70 may be the same, but the invention is not limited thereto. For example, when the color of the phosphor included in the phosphor layer 50 is the same as the color of the lens 70, some of the light emitted from the light emitting device 30 passes through the phosphor layer 50 and the lens 70 and is emitted to the outside of the lighting device, and the other portion of the light may not pass through the phosphor layer 50 but be incident to the lens 70 and may not pass through the lens 70 and thus may not be emitted to the outside. Accordingly, the light emitted from the light emitting device 30 is divided into the light emitted to the outside by the phosphor layer 50 and the light that cannot be emitted to the outside, and the image of the lighting device on the outside may be implemented according to the pattern shape of the phosphor layer 50.

The thickness of the phosphor layer 50 is 5 μm or more and may be thinner than the thickness of the diffusion layer 55, but is not limited thereto. When the thickness of the phosphor layer 50 is greater than the thickness of the diffusion layer 55 or less than 5 μm, the pattern shape of the phosphor layer 50 may not be recognized when the lighting device is turned on to emit light to the outside. In addition, since the diffusion layer 55 is disposed on the uppermost layer of the lighting module 60, when the lighting device is not turned on, the diffusion layer 55 is recognized from the outside first, so that the external image of the lighting device may be improved.

As described above, in the modified example of the lighting device according to the embodiment, the hot spot phenomenon may be prevented and an image of the phosphor layer 50 pattern shape may be realized.

Figure 14:
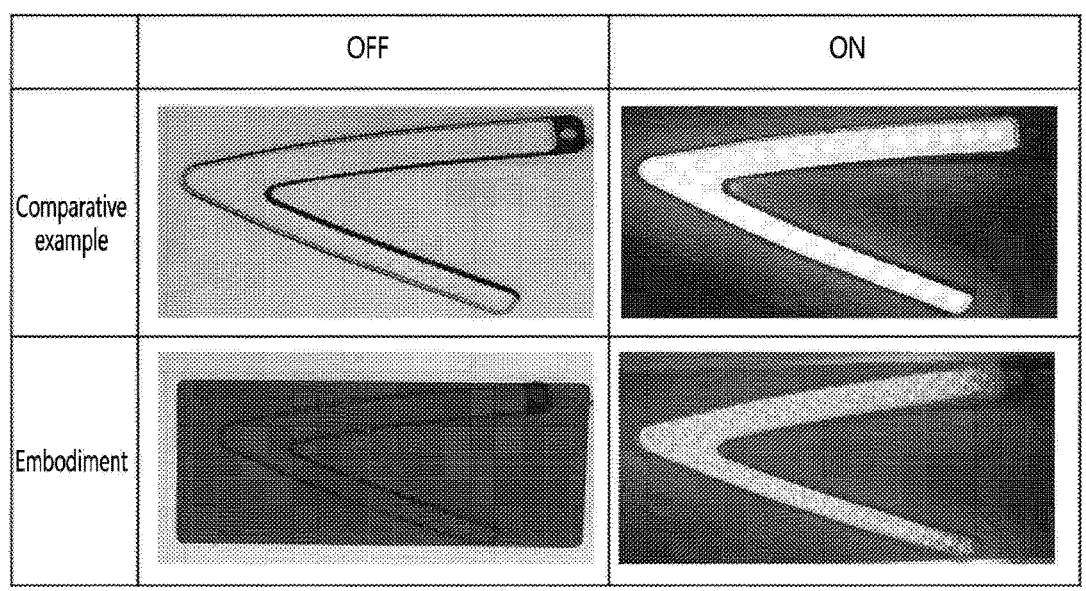
FIG. 14 is a diagram illustrating a comparison of a lighting device according to a modified example of the lighting device according to the embodiment and a lighting device according to a comparative example.

FIG. 14 is a view showing comparison of lighting devices according to Examples and Comparative Examples. As shown in FIG. 13, the embodiment relates to a lighting device in which a pattern of a phosphor layer 50 is disposed to correspond to an upper portion of the light emitting device 30 and a red lens is disposed on the phosphor layer 50, and Comparative Example relates to a lighting device in which a phosphor layer is not disposed on the light emitting device and a red lens is not disposed on the light emitting device.

When comparing the comparative example and the embodiment with reference to FIG. 14, when the lighting device of the comparative example and the embodiment is not turned on, in the embodiment, the red lens is disposed outside, and the lighting device appears red when the lighting device is not turned on. Therefore, the external image may be improved compared to the comparative example.

In addition, when the lighting devices of Comparative Example and Embodiment are turned on, in Comparative Example, the light emitting device disposed inside the lighting device is projected as it is, but in the embodiment, by the phosphor layer 50 disposed on the light emitting device 30, since the image of the light emitting device 30 disposed inside the lighting device is not projected, the external image may be improved. In addition, since the lighting device according to the embodiment recognizes an image corresponding to the pattern of the phosphor layer 50 from the outside, it is possible to implement an image of the lighting device according to the shape of the pattern of the phosphor layer 50, so that an image of the lighting device may be implemented and the lighting device capable of implementing various images may be provided.

Figure 15:
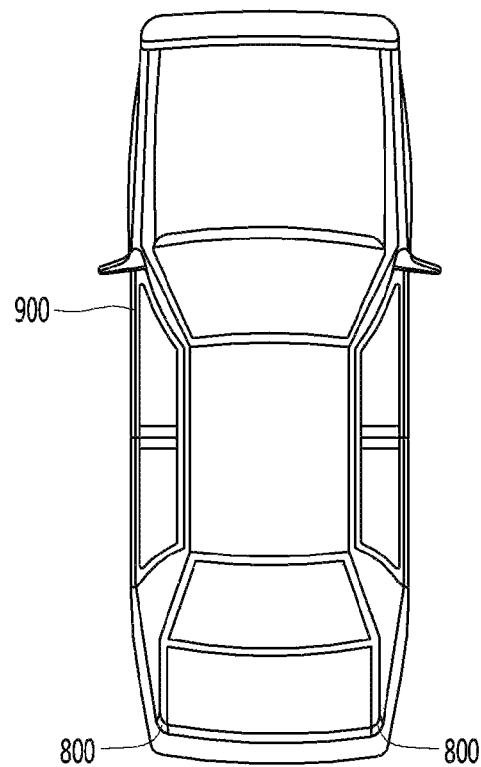
FIG. 15 is a plan view of a vehicle to which a lamp having a lighting module according to an embodiment is applied.
Figure 16:
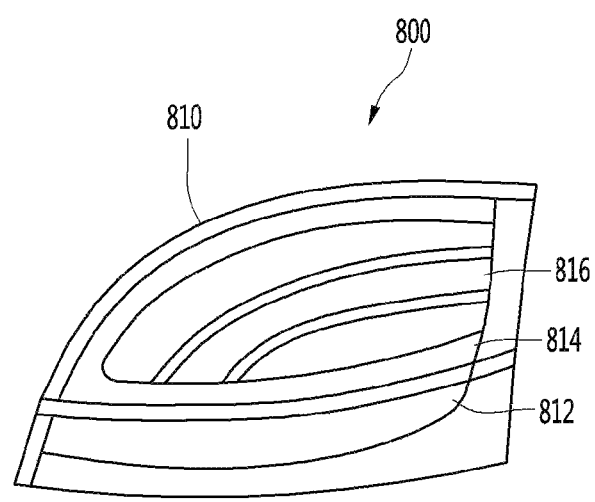
FIG. 16 is a view illustrating a lamp having a lighting module or a lighting device according to an embodiment.

FIG. 15 is a view showing a vehicle lamp having a lighting module or lighting device according to an embodiment, and FIG. 16 is a plan view of a vehicle to which the vehicle lamp of FIG. 15 is applied.

Referring to FIGS. 15 and 16, the rear light 800 in the vehicle 900 may include a first lamp unit 812, a second lamp unit 814, a third lamp unit 816, and a housing 810. Here, the first lamp unit 812 may be a light source for the role of a direction indicator, the second lamp unit 814 may be a light source for the role of a vehicle width lamp, and the third lamp unit 816 may be a light source for the role of a brake light. At least one or all of the first to third lamp units 812, 814, and 816 may include the lighting module disclosed in the embodiment. The housing 810 accommodates the first to third lamp units 812, 814, and 816, and may be made of a light-transmitting material. In this case, the housing 810 may have a curve according to the design of the vehicle body, and the first to third lamp units 812, 814, and 816 may be implemented a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, and the like described in the embodiments above are included in at least one embodiment of the invention, and are not necessarily limited to only one embodiment. Furthermore, the features, structures, effects, and the like illustrated in each embodiment may be combined or modified for other embodiments by a person having ordinary knowledge in the field to which the embodiments belong. Accordingly, contents related to such combinations and modifications should be construed as being included in the scope of the invention.

In addition, although the examples have been described above, these are only examples and do not limit the invention, and those of ordinary skill in the field to which the invention pertains are illustrated above within the scope not departing from the essential characteristics of the present embodiment. It will be seen that various modifications and applications that have not been made are possible. For example, each component specifically shown in the embodiment can be modified and implemented. And differences related to these modifications and applications should be construed as being included in the scope of the invention defined in the appended claims.

The invention claimed is:

1. A lighting device comprising:
a lighting module emitting a first light and a second light;
a housing disposed to surround side surfaces of the lighting module and coupled to the lighting module; and
a lens disposed on the lighting module to block light of a shorter wavelength among the first light and the second light and to transmit light of a longer wavelength among the first light and the second light,
wherein the lighting module includes:
a substrate;
a plurality of light emitting devices disposed on the substrate and emitting the first light;
a resin layer covering the plurality of light emitting devices and disposed on the substrate; and
a phosphor layer disposed on the resin layer and converting the first light into the second light,
wherein the resin layer seals the plurality of light emitting devices and is in contact with an upper surface and side surfaces of each of the light emitting devices,
wherein the first and second light travel through the phosphor layer a direction of the lens,
wherein the second light transmits through the lens,
wherein the resin layer is disposed between the plurality of light emitting devices and the phosphor layer,
wherein the phosphor layer is disposed to cover all outside side surfaces of the resin layer and an upper surface of the resin layer such that the resin layer is enclosed by the phosphor layer and the substrate,
wherein a content of red phosphor of the phosphor layer is 2% or more and 10% or less with respect to a weight of the phosphor layer,
wherein the housing is disposed on a side surface of the lens, and the lens is coupled to the housing,
wherein the lens is disposed on the phosphor layer,
wherein the lens is a lens of a red color,
wherein the housing has a recess with an open top, a bottom portion disposed under the recess, and a sidewall disposed around the recess,
wherein the substrate, the plurality of light emitting devices, the resin layer, the phosphor layer, and the lens are disposed in the recess of the housing,
wherein the substrate is disposed between the resin layer and the bottom portion of the housing,
wherein side portions of the phosphor layer are disposed between the sidewall of the housing and the resin layer, and
wherein an upper end of the sidewall of the housing are disposed at a higher position than a lower surface of the lens.

2. The lighting device of claim 1,
wherein the lens is disposed to be spaced apart from the phosphor layer by a predetermined distance with a gap, and
wherein the phosphor layer extends to the all outside side surfaces of the resin layer and is in contact with an upper surface of the substrate.

3. The lighting device of claim 1,
wherein the lower surface of the lens is in contact with an upper surface of the phosphor layer,
wherein the phosphor layer extends to the all outside side surfaces of the resin layer and is in contact with an upper surface of the substrate, and
wherein the housing reflects the first and second lights traveling within the recess.

4. The lighting device of claim 1, comprising
an outer lens disposed on the lens, and
wherein the lens is an inner lens,
wherein the upper end of the sidewall of the housing are disposed at a higher position than a lower surface of the outer lens.

5. The lighting device of claim 4,
wherein the outer lens is arranged to be spaced apart from the lens by a predetermined distance with a gap,
wherein the outer lens is a transparent lens, and
wherein the phosphor layer is in contact with the upper surface and the all outside side surfaces of the resin layer.

6. The lighting device of claim 4,
wherein the lower surface of the outer lens is in contact with an upper surface of the lens, and
wherein the outer lens is a transparent lens.

7. The lighting device of claim 4,
wherein the outer lens is a transparent lens.

8. The lighting device of claim 1,
wherein light efficiencies of the first light and the second light passing through the phosphor layer are 170% to 210% of light efficiencies of the second light passing through the lens.

9. A lighting device comprising:
a lighting module;
a housing disposed to surround side surfaces of the lighting module and coupled to the lighting module; and
a lens disposed on the lighting module;
wherein the lighting module includes:
a substrate;
a plurality of light emitting devices disposed on the substrate and emitting a blue light;
a resin layer covering the plurality of light emitting devices and disposed on the substrate;
a diffusion layer disposed to cover the resin layer; and
a phosphor layer disposed between the resin layer and the diffusion layer;
wherein the resin layer seals the plurality of light emitting devices and is in contact with an upper surface and side surfaces of each of the light emitting devices,
wherein the phosphor layer converts the blue light into a red light having a longer wavelength than the blue light,
wherein the lens absorbs or reflects the blue light and transmits the red light,
wherein the lens is a red lens,
wherein the housing is disposed on a side surface of the lens, and the lens is coupled to the housing,
wherein the lens is disposed on the diffusion layer,
wherein a content of red phosphor of the phosphor layer is 2% or more and 10% or less with respect to a weight of the phosphor layer, wherein the housing has a recess with an open top, a bottom portion disposed under the recess, and a sidewall disposed around the recess, wherein the substrate, the plurality of light emitting devices, the resin layer, the diffusion layer, the phosphor layer, and the lens are disposed in the recess of the housing, wherein the substrate is disposed between the resin layer and the bottom portion of the housing, wherein side portions of the phosphor layer are disposed between the sidewall of the housing and the resin layer, and wherein an upper end of the sidewall of the housing are disposed at a higher position than a lower surface of the lens.

10. The lighting device of claim 9, wherein the diffusion layer is disposed surrounding side and upper surfaces of the resin layer, and wherein the housing reflects the blue and red lights traveling within the recess.

11. The lighting device of claim 9, wherein the phosphor layer is disposed in a region overlapping each of the plurality of light emitting devices in a vertical direction.

12. A lighting device comprising:

a substrate;

a plurality of light emitting devices disposed on the substrate and emitting a first light;

a resin layer covering the plurality of light emitting devices and disposed on the substrate;

a phosphor layer disposed on the resin layer and converting the first light into a second light; and a housing disposed to surround side surfaces of the substrate and the phosphor layer;

a lens that blocks the first light and transmits the second light, wherein the resin layer seals the plurality of light emitting devices, and is in contact with upper surfaces and side surfaces of each of the plurality of light emitting devices, wherein the first light is blue, wherein the second light is red, wherein the lens is a red lens, wherein the resin layer is disposed between the plurality of light emitting devices and the phosphor layer, wherein the phosphor layer is disposed to cover all outside side surfaces of the resin layer and an upper surface of the resin layer such that the resin layer is enclosed by the phosphor layer and the substrate, wherein a content of red phosphor of the phosphor layer is 2% or more and 10% or less compared to a weight of the phosphor layer, wherein the housing is disposed on a side surface of the lens, and the lens is coupled to the housing, wherein the lens is disposed on the phosphor layer, wherein the housing has a recess with an open top, a bottom portion disposed under the recess, and a sidewall disposed around the recess, wherein the substrate, the plurality of light emitting devices, the resin layer, the phosphor layer, and the lens are disposed in the recess of the housing, wherein the substrate is disposed between the resin layer and the bottom portion of the housing, wherein side portions of the phosphor layer are disposed between the sidewall of the housing and the resin layer, and wherein an upper end of the sidewall of the housing are disposed at a higher position than a lower surface of the lens.

13. The lighting device of claim 12, wherein the phosphor layer converts the blue light emitted from the light emitting devices into the red light, wherein the phosphor layer extends to the all outside side surfaces of the resin layer and is in contact with an upper surface of the substrate, and wherein the housing reflects the blue and red lights traveling within the recess.

14. The lighting device of claim 12, wherein the lower surface of the lens is spaced apart from or in contact with an upper surface of the phosphor layer, wherein the phosphor layer extends to the all outside side surfaces of the resin layer and is in contact with an upper surface of the substrate.

15. The lighting device of claim 12, comprising an outer lens disposed on the lens, wherein the lens is an inner lens, and wherein the outer lens is a transparent lens.

16. The lighting device of claim 15, wherein a lower surface of the outer lens is spaced apart from or in contact with an upper surface of the lens.

17. The lighting device of claim 12, wherein light efficiencies of the first light and the second light passing through the phosphor layer are 170% to 210% of that of the second light passing through the lens.

18. The lighting device of claim 12, wherein a thickness of the resin layer is thicker than a thickness of the substrate and a thickness of the phosphor layer.

19. The lighting device of claim 12, wherein an interval between the light emitting devices is equal to or greater than a thickness of the resin layer.

20. The lighting device of claim 12, wherein the lens is formed of a material of polymethylmethacrylate (PMMA) or polycarbonate (PC), and wherein the lighting device appears red when the lighting device is not turned on.

* * * * *